United States Patent [19]

Raddant

[11] Patent Number: 5,379,452
[45] Date of Patent: Jan. 3, 1995

[54] ACTIVE FREQUENCY SEPARATING CIRCUIT

[75] Inventor: Hans-Joachim Raddant, Berlin, Germany

[73] Assignee: Robert Bosch GmbH, Stuttgart, Germany

[21] Appl. No.: 997,286

[22] Filed: Dec. 23, 1992

[30] Foreign Application Priority Data

Mar. 13, 1992 [DE] Germany ............................ 4208062

[51] Int. Cl.⁶ .......................... H04B 1/18; H03H 7/46
[52] U.S. Cl. .................................. 455/143; 455/188.1; 455/281
[58] Field of Search ................... 455/142–144, 455/188.1, 191.1, 280, 289, 290, 281; 333/129, 131, 167, 175, 132

[56] References Cited

U.S. PATENT DOCUMENTS

| | | | |
|---|---|---|---|
| 3,875,514 | 4/1975 | Klein | 455/143 |
| 3,965,426 | 6/1976 | Ringland | 455/143 |
| 5,140,700 | 8/1992 | Kennedy | 455/142 |

FOREIGN PATENT DOCUMENTS

| | | |
|---|---|---|
| 0023943A1 | 2/1981 | European Pat. Off. . |
| 2443582 | 3/1976 | Germany . |
| 3802810C2 | 8/1989 | Germany . |

OTHER PUBLICATIONS

Sheffield, Berthold, "Filter Design Simplified", *Audio Engineering*, May 1951, pp. 26, 28, 58.

*Primary Examiner*—Curtis Kuntz
*Assistant Examiner*—Mark D. Wisler
*Attorney, Agent, or Firm*—Frishauf, Holtz, Goodman & Woodward

[57] ABSTRACT

In an active circuit which separates and amplifies signals received via an antenna (A) into a higher-frequency FM band and a lower-frequency FM band, weakening of the FM signals by the AM-band amplifier is avoided by adding, to the previously known circuit which has first, second, and third capacitors (C1, C2, C3), a third inductance (L3) between the second (C2) and third (C3) capacitors, and by removing any serial inductance from the adaptor or matching circuit (AP) at the input of the FM amplifier stage (UKW).

5 Claims, 1 Drawing Sheet

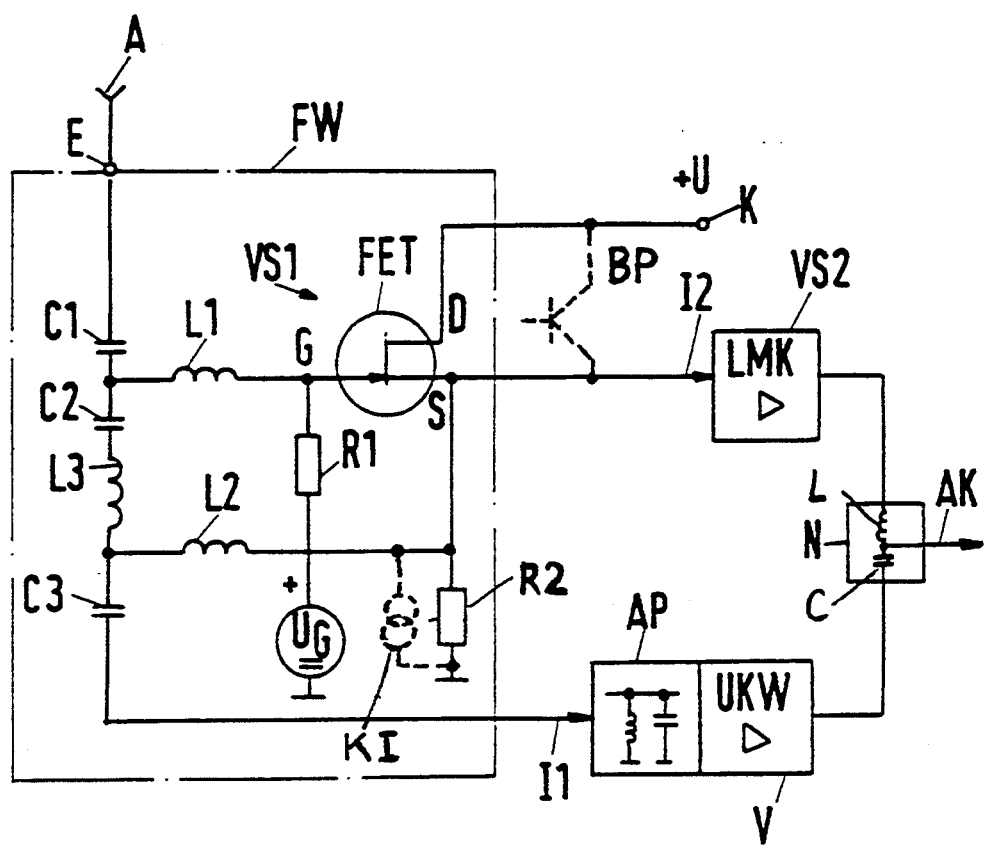

ACTIVE FREQUENCY SEPARATING CIRCUIT

CROSS-REFERENCE TO COMMONLY OWNED PATENT

German Patent DE 38 02 810.7, filed Jan. 30, 1988 and issued Mar. 31, 1991.

FIELD OF THE INVENTION

The invention relates to an active frequency separating circuit of the kind having a field effect transistor (FET) amplifier, and separating signals received by means of a receiving antenna into a range of higher frequencies and a range of lower frequencies, whereby the base of the receiving antenna is connected, firstly, by a series connection consisting of a first, a second and a third capacitor, to the input of an adaptor circuit of a first amplifier for signals of a higher frequency range, secondly, by way of the first capacitor and a first inductance series-connected therewith, to the gate electrode of a field effect transistor, forming a first amplifier stage for a lower frequency range and, thirdly, by way of the first and second capacitors and a second inductance series connected therewith, to the source electrode of the field effect transistor, as well as to the input of a second amplifier stage for signals of the lower frequency range, and to ground by way of a resistor.

BACKGROUND OF THE INVENTION

An active frequency separating circuit is known (German Patent DE-PS 38 02 810) which has the advantages that, to a large extent, a deleterious capacitive loading is avoided for AM-band signals, and that the active components of FM and AM amplifiers are affected only insignificantly by signals in the respective other range. It has been found, however, that the AM amplifier of the known active frequency separating circuit diminishes the FM signal somewhat because the adaptor circuit of the FM amplifier is conventionally provided with a series inductance at its input which, together with the three series-connected capacitors, forms a series resonance circuit. Since the center one of the three capacitors has the lowest capacitance value, the high voltage or reference point of the series resonance circuit is located between the center capacitor and said inductance. Because of the high impedance of the high reference point, the FM (Ultra-Short-Wave) signal experiences weakening even, at low loads.

THE INVENTION

It is an object of the invention to improve an active frequency separating circuit of the kind referred to above, in such a way that weakening of the FM signal by the AM amplifier is substantially avoided.

In accordance with the invention, there is provided an active frequency separating circuit in which a third inductance is connected between the second and third capacitors, in which, furthermore, the second inductance, connected to the source electrode of the field effect transistor (FET), branches off between the third inductance and the third capacitor, and in which the adaptor circuit does not include a series inductance.

This offers the advantage that the FM signals, fed by way of the series resonance circuit, experience noticeably reduced weakening. Unavoidable losses from dissipation caused by connecting wires and the connecting terminals of the capacitors and inductances of the active frequency separator, and losses resulting from the load on the FM signal by the field effect transistor, do not cause diminishing of the FM signals because the unconnected high reference point of the series resonance circuit of the active frequency separator lies between the second capacitor and the third inductance, series-connected therewith, whereas the field effect transistor is connected to the junctions between the first and second capacitors, or between the third inductance and the third capacitor, as the case may be, which, in the FM range are of relatively low ohmic value.

DRAWING

FIG. 1 shows a preferred embodiment of the invention.

DETAILED DESCRIPTION OF THE EMBODIMENT

In the FIGURE representing a block circuit diagram of the active frequency separating circuit, A designates an antenna, preferably an automotive antenna, whose length, for the receipt of AM (long-middle-short wavelength) band, is short, relative to the median wavelength of the frequencies to be received.

The base of the antenna A is connected to the input E of an active frequency separator FW which is provided with a series connection of a first capacitor C1, a second capacitor C2, a third inductance L3 and a third capacitor C3 which is connected to the input I1 of an FM amplifier V for signal frequencies in the FM or UKW band. To the input of the FM amplifier V, there is connected an adaptor circuit AP which is provided, for instance, with a shunt capacitor and a shunt inductance, but which, at its input, is not provided with a series inductance. A first inductance L1 connects the junction between the first and second capacitors C1 and C2 to a gate electrode G of a field effect transistor (FET), operating or driven in a drain mode, and which constitutes a first amplifier stage VS1 for signal frequencies in the AM or "LMK" band.

The drain electrode D of the field effect transistor FET is connected by way of a pole K to positive potential, and the gate electrode G is connected to a constant DC voltage source $+U_G$, via a resistor R1. At the junction between the third inductance L3 and the third capacitor C3, there is provided a second inductance L2 which is connected, firstly to source electrode S, secondly to the input terminal I2 of a second amplifier stage VS2 for signals in the AM band and thirdly, by way of a resistor R2, to ground. Resistor R2 can be replaced by a constant-current source KI.

The output terminals of the two amplifier stages V and VS2 are preferably connected to the input terminals of an adding circuit N, to the output terminal of which there is connected an antenna cable AK. The adding circuit N consists of an inductance L and a capacitor C (see FIGURE).

OPERATION

The function of the circuit described above is as follows:

For the FM signals of the received signals supplied by the antenna A, the series connection, consisting of the capacitors C1, C2, C3 and the third inductance L3, constitutes a low-ohmic path to the input I1 of the FM amplifier. The inductances L1 and L2 are such as to provide a high resistance to the FM signal voltage, so that this voltage is amplified essentially exclusively by the FM amplifier.

The values of the capacitors C1, C2 and C3 are such that the value of C3 amounts only to one-third to one-fourth of the values of C1 and C2. For this reason, the FM resonant frequency of the series resonance circuit C1, C2, C3, L3 is essentially dependent upon L3 and C2, and the high reference point of this circuit is present on the very short and, therefore, low dissipation loss connection of C2 with L3. The field effect transistor FET, for amplifying the AM signals, is connected to the series resonance circuit C1, C2, C3, L3 at two points which, because of their lower FM impedance relative to the high reference point of the series resonance circuit, react markedly less critically to dissipation losses.

The AM signals are fed to the gate electrode G of the field effect transistor FET by way of the first capacitor C1 and the first inductance L1, and to the source electrode S by way of the second capacitor C2, the third inductance L3 und the second inductance L2. The inductances L1, L2 and L3 constitute a relatively low resistance for the AM signals, so that, at these frequencies, the second capacitor C2 is positioned directly between source and gate electrodes S and G, and provides a positive feedback.

The bias voltage for the field effect transistor FET is provided by the constant DC voltage source $+U_G$ and the resistor R1. The AM voltage present between source electrode S of the field effect transistor FET and ground is additionally amplified by the second amplifier stage VS2.

By the mentioned positive coupling, the capacitor C2 is dynamically reduced for AM-band signals, and, therefore, the detrimental effect on the AM signals by the FM amplifier V is reduced. For this reason, the capacitor C2 may be made large—this is necessary for a good coupling of the FM amplifier—without resulting in a significant detrimental capacitance. In this manner, a good signal-to-noise ratio may be achieved for AM, as well as for FM, signals.

In an improved embodiment, the resistor R2 is replaced by a constant-current source KI, as is known to the skilled artisan from other applications. This results in an increase in the voltage amplification of the field effect transistor FET to a value approaching 1. The value of the capacitor C2 is dynamically further reduced, as is the detrimental loading effect of the FM amplifier on the AM-band signal. As a result, the AM signal, at the gate electrode G of the field effect transistor FET, increases.

Compensating of the frequency separating circuit is not necessary, either in the AM branch including the field effect transistor FET, inductances L1, L2, L3 and the capacitors C1, C2, or in the FM branch including the three series-connected capacitors C1, C2, C3 and the third inductance L3.

The respective output voltages of the FM amplifier V, and of the AM amplifier, formed by amplifier stages VS1 and VS2, are each fed to the adding circuit N and via the antenna cable AK to the input of a car radio, not shown.

Instead of the field effect transistor FET, a bipolar transistor BP may be substituted. Various changes and modifications are possible within the scope of the inventive concept.

I claim:

1. An active frequency separating circuit, for separating signals received on a receiving antenna (A) into a band of higher frequency signals and a band of lower frequency signals, comprising
    first amplifier means (V) for amplifying said signals of said higher frequency band;
    adaptor circuit means (AP) connected between said antenna (A) and an input of said first amplifier means (V);
    first, second and third series-connected capacitor means (C1, C2, C3) for connecting said adaptor circuit means (AP) to said antenna (A);
    second amplifier means (VS1) for amplifying said signals of said lower frequency band and comprising a transistor including a gate electrode (G) and a source electrode (S);
    first inductance means (L1) series-connected to said first capacitor means (C1) and connecting said antenna (A) to said gate electrode (G);
    third amplifier means (VS2) for amplifying signals of said lower frequency band after amplification by said second amplifier means (VS1);
    second inductance means (L2) series-connected to said first and second capacitor means (C1, C2) and connecting said antenna (A) to said source electrode (S) and to an input of said third amplifier means (VS2);
    wherein, in order to displace a high-voltage point of the separating circuit away from an input terminal of said second inductance means (L2) and thereby reduce high-frequency losses,
    a third inductance (L3) is provided, connected between said second capacitor means (C2) and said third capacitor means (C3);
    said input terminal of said second inductance means, remote from said source electrode (S), is connected between said third inductance (L3) and said third capacitor means (C3); and
    said adaptor circuit means (AP) is formed without a serial inductance therein.

2. An active frequency separating circuit as defined in claim 1, further comprising
    a resistor (R2) having one terminal connected to said source electrode (S) and one terminal connected to ground.

3. An active frequency separating circuit as defined in claim 1, further comprising
    a constant-current source having one terminal connected to said source electrode (S) and one terminal connected to ground.

4. An active frequency separating circuit as defined in claim 1, wherein said transistor is a Field Effect Transistor (FET).

5. An active frequency separating circuit as defined claim 1, wherein said transistor is a bipolar transistor.

* * * * *